United States Patent
Ma et al.

(10) Patent No.: US 11,085,954 B2
(45) Date of Patent: Aug. 10, 2021

(54) CONTROL CIRCUIT, BIAS CIRCUIT, AND CONTROL METHOD

(71) Applicant: SMARTER MICROELECTRONICS (SHANGHAI) CO., LTD., Shanghai (CN)

(72) Inventors: Jun Ma, Shanghai (CN); Qiang Su, Shanghai (CN); Jiangtao Yi, Shanghai (CN); Yang Li, Shanghai (CN)

(73) Assignee: SMARTER MICROELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/685,790

(22) Filed: Nov. 15, 2019

(65) Prior Publication Data
US 2020/0083807 A1 Mar. 12, 2020

Related U.S. Application Data

(63) Continuation of application No. PCT/CN2017/112179, filed on Nov. 21, 2017.

(30) Foreign Application Priority Data

Jun. 8, 2017 (CN) .......................... 201710427073.2

(51) Int. Cl.
*H03F 3/04* (2006.01)
*G01R 19/00* (2006.01)
*H03F 1/30* (2006.01)
*H02M 3/156* (2006.01)

(52) U.S. Cl.
CPC ......... *G01R 19/0038* (2013.01); *H03F 1/301* (2013.01); *H02M 3/156* (2013.01)

(58) Field of Classification Search
CPC ............... H03F 1/22; H03F 1/223; H03F 3/04
USPC .......................................... 330/288, 296, 311
See application file for complete search history.

(56) References Cited

U.S. PATENT DOCUMENTS 10,353,421 B2 * 7/2019 Chen ........................ G05F 3/262

* cited by examiner

*Primary Examiner* — Steven J Mottola
(74) *Attorney, Agent, or Firm* — Syncoda LLC; Feng Ma

(57) ABSTRACT

A control circuit can be applied to a bias circuit including a first transistor and a second transistor with their gates connected. The first and second transistors are configured to amplify an input reference direct current (DC) current of the bias circuit to obtain a bias DC current. The control circuit includes: a detection circuit configured to compare a first DC voltage with a second DC voltage to obtain a comparison result; the first DC voltage being a drain DC voltage of the first transistor; and the second DC voltage being a drain DC voltage of the second transistor; and an adjustment circuit configured to adjust the first DC voltage and the second DC voltage by using the comparison result, such that the drain DC voltage of the first transistor equals the drain DC voltage of the second transistor when the bias circuit is in operation.

18 Claims, 8 Drawing Sheets

901 Compare a first DC voltage with a second DC voltage to obtain a comparison result

902 Adjust the first DC voltage and the second DC voltage by using the comparison result such that a drain DC voltage of the first transistor is the same as a drain DC voltage of the second transistor when the bias circuit is in operation

FIG. 9

1001 A first transistor and a second transistor amplify an input reference DC current of a bias circuit to obtain a bias DC current, and the second transistor generates a target output signal based on an input signal of a bias circuit by using the bias DC current

1002 Control a third transistor to output the target output signal by using the generated first bias DC voltage matched with the power level such that the target output signal meets a preset linear relation

CONTROL CIRCUIT, BIAS CIRCUIT, AND CONTROL METHOD

CROSS-REFERENCE TO RELATED APPLICATIONS

The present application is continuation of International Application No. PCT/CN2017/112179 filed on Nov. 21, 2017, which claims priority to Chinese Application No. 201710427073.2 filed on Jun. 8, 2017. The disclosures of these applications are hereby incorporated by reference in their entirety.

BACKGROUND

A power amplifier is an active circuit that requires a bias circuit to provide an appropriate bias direct current (DC) current and an appropriate bias DC voltage for normal operation, so as to meet all indexes of the power amplifier, such as linearity, efficiency, magnitude of power, and the like.

SUMMARY

The present disclosure relates generally to electronic control circuits, and more specifically to a control circuit, a bias circuit and a control method.

A control circuit, a bias circuit and a control method are provided in various embodiments of the present disclosure.

A control circuit provided in the embodiments of the present disclosure is applied to a bias circuit. The bias circuit includes: a first transistor and a second transistor, where a gate of the first transistor is connected to a gate of the second transistor, the first transistor and the second transistor are configured to amplify an input reference direct current (DC) current of the bias circuit to obtain a bias DC current, and the second transistor generates a target output signal based on an input signal of the bias circuit by using the bias DC current. The control circuit includes: a detection circuit and an adjustment circuit.

The detection circuit is configured to compare a first DC voltage with a second DC voltage to obtain a comparison result. The first DC voltage is a drain DC voltage of the first transistor, and the second DC voltage is a drain DC voltage of the second transistor.

The adjustment circuit is configured to adjust the first DC voltage and the second DC voltage by using the comparison result, such that the drain DC voltage of the first transistor is equal to the drain DC voltage of the second transistor when the bias circuit is in operation.

In the above technical solution, the adjustment circuit is configured to control conduction degree of the first transistor and conduction degree of the second transistor by using the comparison result, so as to adjust the first DC voltage and the second DC voltage.

In the above technical solution, the adjustment circuit is configured to control the conduction degree of the first transistor and the conduction degree of the second transistor by pulling up or pulling down the drain DC voltage of the first transistor and the drain DC voltage of the second transistor by using the comparison result, so as to adjust the first DC voltage and the second DC voltage.

A bias circuit is provided in the embodiment of the present disclosure, which includes a first transistor, a second transistor, a third transistor, a control circuit and a voltage generation circuit.

A gate of the first transistor is connected to a gate of the second transistor. The first transistor and the second transistor are configured to amplify an input reference DC current of the bias circuit to obtain a bias DC current. And the second transistor generates a target output signal based on an input signal of the bias circuit by using the bias DC current.

The voltage generation circuit is configured to control the third transistor to output the target output signal by using a generated first bias DC voltage matched with a power level such that the target output signal meets a preset linear relationship.

The control circuit includes: a detection circuit, configured to compare a first DC voltage with a second DC voltage to obtain a comparison result, where the first DC voltage is a drain DC voltage of the first transistor, and the second DC voltage is a drain DC voltage of the second transistor; an adjustment circuit, configured to adjust the first DC voltage and the second DC voltage by using the comparison result, such that the drain DC voltage of the first transistor is equal to the drain DC voltage of the second transistor when the bias circuit is in operation.

In the above technical solution, the adjustment circuit is configured to control conduction degree of the first transistor and conduction degree of the second transistor by using the comparison result, so as to adjust the first DC voltage and the second DC voltage.

In the above technical solution, the adjustment circuit is configured to control the conduction degree of the first transistor and the conduction degree of the second transistor by pulling up or pulling down the drain DC voltage of the first transistor and the drain DC voltage of the second transistor by using the comparison result, so as to adjust the first DC voltage and the second DC voltage.

In the above technical solution, the voltage generation circuit is further configured to generate a second bias DC voltage matched with a power level. The second bias DC voltage is a gate DC voltage of the first transistor and a gate DC voltage of the second transistor. The first bias DC voltage and the second bias DC voltage meet a preset condition. The second DC voltage changes with changes of the first bias DC voltage and second bias DC voltage.

In the above technical solution, the voltage generation circuit is configured to generate at least one first bias DC voltage matched with the power level by using at least one resistor and at least one current source. Each of the at least one first bias DC voltage controls one third transistor to output the target output signal, such that the target output signal meets the preset linear relationship.

A control method is provided in the embodiments of the present disclosure, which includes the following operations.

A first DC voltage is compared with a second DC voltage to obtain a comparison result. The first DC voltage is a drain DC voltage of a first transistor of a bias circuit. The second DC voltage is a drain DC voltage of a second transistor of the bias circuit.

The first DC voltage and the second DC voltage are adjusted by using the comparison result, such that the drain DC voltage of the first transistor is equal to the drain DC voltage of the second transistor when the bias circuit is in operation.

A gate of the first transistor is connected to a gate of the second transistor. The first transistor and the second transistor amplify an input reference DC current of the bias circuit to obtain a bias DC current. The second transistor generates a target output signal based on an input signal of the bias circuit by using the bias DC current.

In the above technical solution, the adjusting the first DC voltage and the second DC voltage by using the comparison result includes the following operations.

Conduction degree of the first transistor and conduction degree of the second transistor are controlled by using the comparison result so as to adjust the first DC voltage and the second DC voltage.

In the above technical solution, the adjusting the first DC voltage and the second DC voltage by using the comparison result includes the following operations.

The conduction degree of the first transistor and the degree conduction of the second transistor are controlled by pulling up or pulling down a gate voltage of the first transistor and a gate voltage of the second transistor by using the comparison result so as to adjust a first voltage and a second voltage.

A control circuit, a bias circuit and a control method are provided in the embodiments of the present disclosure. A first DC voltage is compared with a second DC voltage to obtain a comparison result. The first DC voltage is a drain DC voltage of a first transistor, and the second DC voltage is a drain DC voltage of a second transistor. The first DC voltage and the second DC voltage are adjusted by using the comparison result such that the drain DC voltage of the first transistor is equal to the drain DC voltage of the second transistor when the bias circuit is in operation. A gate of the first transistor is connected to a gate of the second transistor. The first transistor and the second transistor amplify an input reference DC current of the bias circuit to obtain a bias DC current. And the second transistor generates a target output signal based on an input signal of the bias circuit by using the bias DC current. In the embodiment of the present disclosure, the first DC voltage and the second DC voltage are adjusted by using the comparison result of the first DC voltage and second DC voltage such that the drain DC voltage of the first transistor is equal to the drain DC voltage of the second transistor. In this way, the bias circuit can achieve a more stable performance in terms of power level and linearity under the influence of external factors such as a temperature drift and a process drift.

BRIEF DESCRIPTION OF DRAWINGS

FIG. 9 illustrates a flow chart of a control method according to a seventh embodiment of the present disclosure.

FIG. 10 illustrates a flow chart of an implementation method of a bias circuit according to an eighth embodiment of the present disclosure.

DETAILED DESCRIPTION

In some applications, it may be needed to adjust magnitude of a reference DC current and a bias state of each of biasing devices based on different requirements such that different powers are generated with a same bias circuit, and it may also be needed to meet all specifications of the power amplifier, such as linearity, power consumption, and the like.

An adjustable bias circuit can be utilized to output different powers. But there are certain disadvantages of poor DC current control accuracy, inconvenient debugging, process deviation of bias devices and temperature drift that cause to drift to the output power and the linearity.

Various embodiments of the present disclosure address how to control the same bias circuit to output different powers and meet a stability index of the linearity.

Figure 1:
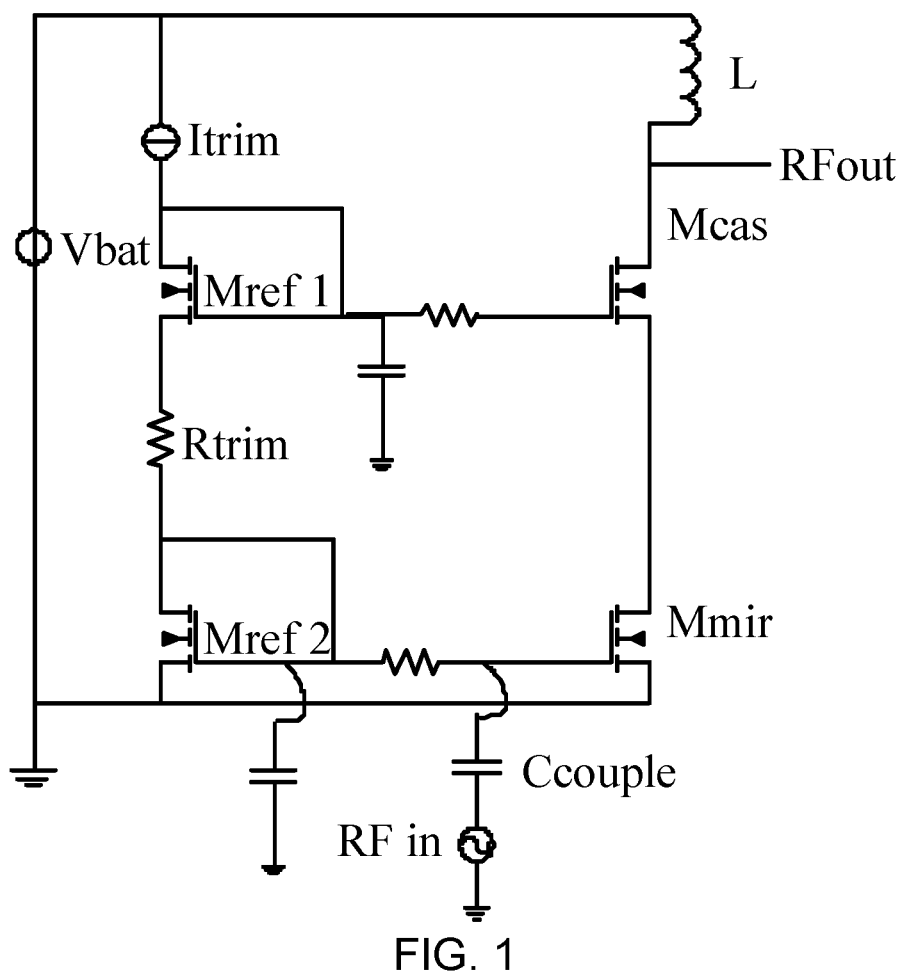
FIG. 1 illustrates a first schematic structural diagram of a bias circuit according to some embodiments.

A circuit composition structure of a bias circuit is shown in FIG. 1. RFin represents an alternative current (AC) (ratio frequency) input signal. RFout represents an output power. Ccouple represents a signal couple capacitor. Vbat represents a power supply. Each of Mref1 and Mref2 represents a bias reference transistor. Mmir represents a direct current (DC) current output transistor. Mcas represents a cascode transistor. L represents a load inductor. Itrim represents a reference DC current source. Rtrim represents an adjustable resistor.

An operation principle of the bias circuit shown in FIG. 1 is described hereinafter. The AC input signal RFin is amplified by different amplification factors under an influence of a bias DC current provided by the bias circuit to obtain different output powers RFout. The input reference DC current Iref of the bias circuit is amplified by Mref2 and Mmir to obtain the bias DC current. A bias voltage is generated for Mcas by Itrim, Rtrim, Mref1 and Mref2 so as to meet a bias requirement of a power amplifier. A specific operation process includes following steps. In case that a resistance of the adjustable resistor Rtrim is zero, since Mref2 is connected to a gate of Mmir, and a drain DC voltage of Mref2 is equal to a drain DC voltage of Mmir, a ratio of a DC current flowing through Mref2 to a DC current flowing through Mmir is equal to a ratio of a size (channel width) of Mref2 to a size (channel width) of Mmir. Therefore, an amplified bias DC current may be outputted from Mmir by adjusting the reference DC current source Itrim in case of the ratio is constant.

However, the following issues may exist. In case that the resistance of Rtrim is not zero, since the drain DC voltage of Mmir is equal to the gate DC voltage of Mref2 plus a voltage drop across Rtrim and then minus a gate-to-source DC voltage of Mcas, and the drain DC voltage of Mref2 is equal to the gate DC voltage of Mref2, such that the drain DC voltage of Mref2 is not equal to the drain DC voltage of Mmir. Therefore, the ratio of the DC current flowing through Mref2 to the DC current flowing through Mmir is not equal to the ratio of the size (channel width) of Mref2 to the size (channel width) of Mmir, resulting in poor control accuracy of the DC current.

In the bias circuit shown in FIG. 1, the cascode transistor Mcas shields the influence of the power supply Vbat on the bias DC current. Based on a requirement on the output power level, a gate voltage of the cascode transistor Mcas is adjusted through Itrim and Rtrim, and the input reference DC current of the bias circuit is amplified through Mref2 and Mmir, thereby meeting the bias requirement of the power amplifier.

However, the bias circuit shown in FIG. 1 has the following disadvantages. First, in case that the resistance of the adjustable resistor Rtrim is not zero, the drain DC voltage of Mref2 is not matched with the drain DC voltage of Mmir and the DC current flowing through Mmir is not proportional to the DC current flowing through Mref2. Therefore, the control accuracy of the DC current is poor. Secondly, the DC current flowing through Mmir (the bias DC current) and the adjustable DC current source (Itrim) are coupled with each other, thereby resulting in inconvenient debugging. Thirdly, process deviation and temperature drift of Mref1, Mref2, Mcas, Mmir and Rtrim prevent the drain DC voltage of Mref2 and the drain DC voltage of Mmir from following each other such that power and linearity of output of the bias circuit are drifted.

Figure 2:
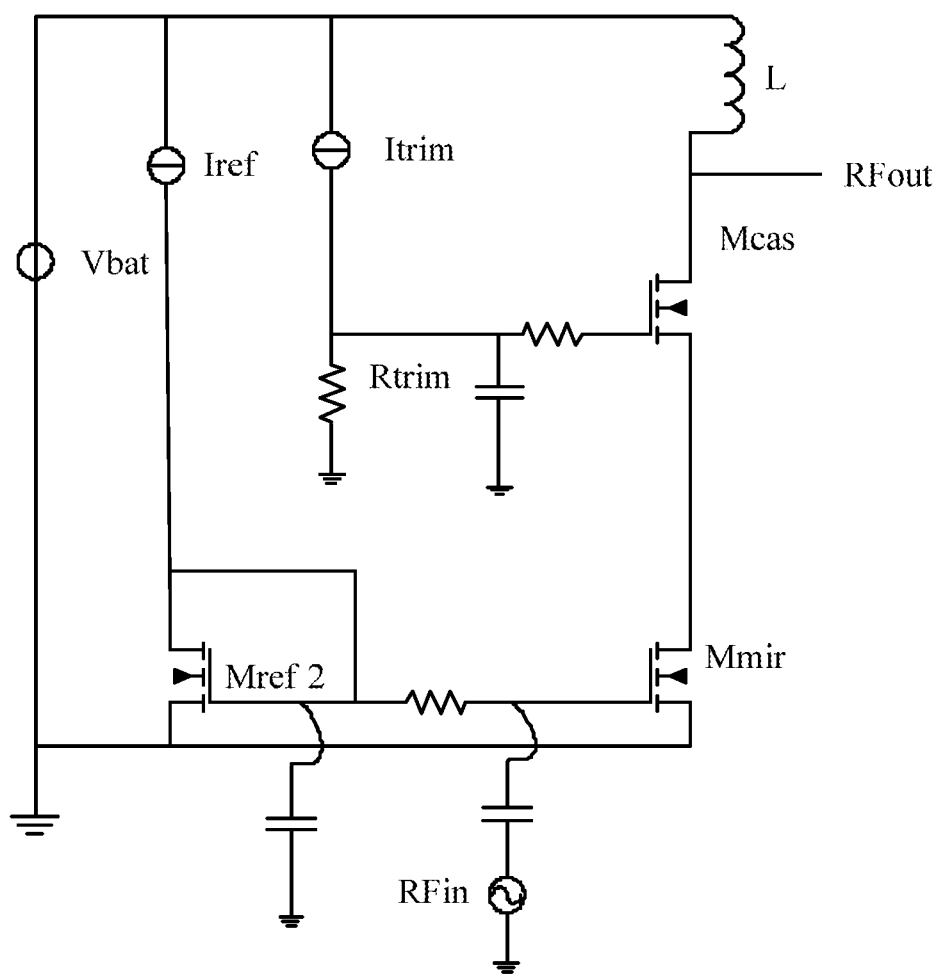
FIG. 2 illustrates a second schematic structural diagram of a bias circuit according to some embodiments.

Based on the disadvantages existing in the bias circuit shown in FIG. 1, a bias circuit shown in FIG. 2 is generated. As shown in FIG. 2, RFin represents an AC (ratio frequency) input signal. RFout represents an output power. Ccouple represents a signal couple capacitor. Vbat represents a power supply. Mref2 represents a bias reference transistor. Mmir represents a DC current output transistor. Mcas represents a cascode transistor. L represents a load inductor. Itrim represents an adjustable DC current source. Rtrim represents an adjustable resistor. Iref represents a reference DC current source.

An operation principle of the bias circuit shown in FIG. 2 is described hereinafter. The AC input signal RFin is amplified by different amplification factors under an influence of a bias DC current provided by the bias circuit to obtain different output powers RFout. The input reference DC current Iref of the bias circuit is amplified by Mref2 and Mmir to obtain the bias DC current, and a bias voltage is generated for Mcas by Itrim and Rtrim, so as to meet a bias requirement of a power amplifier. A specific operation process includes following steps. In case that a drain voltage of Mref2 and a drain voltage of Mmir are equal to each other by adjusting Itrim or Rtrim, since a gate DC potential of Mref2 is equal to a gate DC potential of Mmir, a ratio of a DC current flowing through Mref2 to a DC current flowing through Mmir is equal to a ratio of a size (channel width) of Mref2 to a size (channel width) of Mmir. However, the following disadvantages exist. When Rtrim or Itrim changes, the drain DC voltage of Mmir changes, such that the drain DC voltage of Mref2 and the drain DC voltage of Mmir are not equal to each other. Therefore, the ratio of the DC current flowing through Mref2 to the DC current flowing through Mmir is not equal to the ratio of the size of Mref2 to the size of Mmir, thereby resulting in the poor control accuracy of the DC current.

The advantage of the bias circuit shown in FIG. 2 compared with the bias circuit shown in FIG. 1 is that the adjustable DC current source Itrim and the reference DC current source are separated from each other, thereby facilitating the debugging.

However, the bias circuit shown in FIG. 2 still has the following disadvantages. Firstly, the drain DC voltage of Mref2 is not matched with the drain DC voltage of the Mmir, thereby resulting in the poor control accuracy of the DC current. Secondly, process deviation and temperature drift of Mref1, Mref2, Mcas, Mmir and Rtrim may influence the drain DC voltage of Mref2 and the drain DC voltage of Mmir, such that the power and the linearity of the output of the bias circuit are drifted.

In view of this, in the various embodiments of the present disclosure, a first DC voltage is compared with a second DC voltage to obtain a comparison result, where the first DC voltage is a drain DC voltage of a first transistor of a bias circuit, and the second DC voltage is a drain DC voltage of a second transistor of the bias circuit. The first DC voltage and the second DC voltage are adjusted by using the comparison result such that the drain DC voltage of the first transistor is equal to the drain DC voltage of the second transistor when the bias circuit is in operation. A gate of the first transistor is connected to a gate of the second transistor via a resistor that attenuates an AC signal. The first transistor and the second transistor are configured to amplify an input reference DC current of the bias circuit to obtain a bias DC current, and the second transistor generates a target output signal based on an input signal of the bias circuit by using the bias DC current.

First Embodiment

Figure 3:
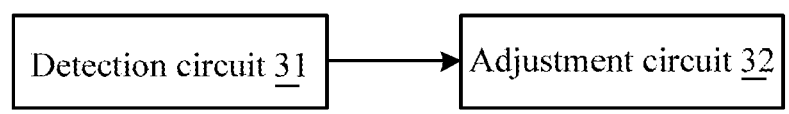
FIG. 3 illustrates a schematic structural diagram of a control circuit according to a first embodiment of the present disclosure.

As shown in FIG. 3, a control circuit is provided in the embodiment. The control circuit includes: a detection circuit 31 and an adjustment circuit 32.

The detection circuit 31 is configured to compare a first DC voltage with a second DC voltage to obtain a comparison result, where the first DC voltage is a drain DC voltage of a first transistor, and the second DC voltage is a drain DC voltage of a second transistor.

The adjustment circuit 32 is configured to adjust the first DC voltage and the second DC voltage by using the comparison result such that the drain DC voltage of the first transistor is equal to the drain DC voltage of the second transistor when the bias circuit is in operation.

A gate of the first transistor is connected to a gate of the second transistor via a resistor that attenuates an AC signal. The first transistor and the second transistor are configured to amplify an input reference DC current of the bias circuit to obtain a bias DC current, and the second transistor generates a target output signal based on an input signal of the bias circuit by using the bias DC current.

In some applications, the input signal of the bias circuit may be a radio frequency input signal. The target output signal of the bias circuit may be radio frequency output signals with different power levels. In case that the power levels of the target output signals are different, a bias circuit is needed to provide different bias DC currents. Here, by adjusting an input reference DC current of the bias circuit, the first transistor and the second transistor amplify the input reference DC current of the bias circuit to obtain the bias DC current that meets an actual demand, and the second transistor generates the target output signals having different power levels based on the input signal of the bias circuit by using the bias DC current.

In some applications, during operation of the bias circuit, when a change of a gate DC voltage of the first transistor causes a change of the drain DC voltage of the first transistor and a change of the drain DC voltage of the second transistor, the detection circuit 31 detects the first DC voltage (the drain DC voltage of the first transistor) and the second DC voltage (the drain DC voltage of the second transistor), and compares them to obtain a comparison result. The adjustment circuit 32 controls the gate DC voltage of the first transistor and a gate DC voltage of the second transistor by using the comparison result. The drain DC voltage of the first transistor is achieved to be equal to the drain DC voltage of the second transistor by adjusting an impedance of the first transistor and an impedance of the second transistor.

In case that the drain DC voltage of the second transistor changes and the drain DC voltage of the first transistor remains unchanged, the detection circuit 31 detects the first DC voltage (the drain DC voltage of the first transistor) and the second DC voltage (the drain DC voltage of the second transistor), and compares the first DC voltage with the second DC voltage to obtain a comparison result. The adjustment circuit 32 controls the gate DC voltage of the first transistor and the gate DC voltage of the second transistor by using the comparison result. The drain DC voltage of the first transistor changes with a change of the drain DC voltage of the second transistor by adjusting the impedance of the first transistor and the impedance of the second transistor, thereby finally ensuring that the drain DC voltage of the first transistor is equal to the drain DC voltage of the second transistor.

In some embodiments, functions of the control circuit may be realized through an operational amplifier.

Since the gate of the first transistor is connected to the gate of the second transistor via the resistor that attenuates an AC signal, the gate DC voltage of the first transistor is equal to the gate DC voltage of the second transistor. Meanwhile, the drain DC voltage of the first transistor is also equal to the drain DC voltage of the second transistor. Here, a ratio of the DC current flowing through the first transistor to the DC current flowing through the second transistor is equal to a radio of a size of the first transistor to a size of the second transistor.

In some embodiments, the adjustment circuit 32 is specifically configured to control conduction degree of the first transistor and conduction degree of the second transistor by using the comparison result so as to adjust the first DC voltage and the second DC voltage.

The conduction degree indicates that a change of the drain DC voltage of the first transistor and a change of the drain DC voltage of the second transistor are realized by changing the impedance of the first transistor and the impedance of the second transistor.

In some embodiments, the adjustment circuit 32 is specifically configured to control a conduction state of the first transistor and a conduction state of the second transistor by pulling up or pulling down the gate DC voltage of the first transistor and the gate DC voltage of the second transistor by using the comparison result so as to adjust the first DC voltage and the second DC voltage.

In some applications, due to an influence of temperature drift or other reasons, the gate DC voltage of the first transistor and the gate DC voltage of the second transistor may change. In case that the gate DC voltage of the first transistor and the gate DC voltage of the second transistor are high, it is needed to pull down the gate DC voltage of the first transistor and the gate DC voltage of the second transistor, thereby ensuring stability of the gate DC voltage of the first transistor and stability of the gate DC voltage of the second transistor. The pull-down implementation process includes: driving an N-type metal-oxide-semiconductor (NMOS) transistor by using the comparison result, where a drain terminal of the NMOS is connected to the gate of the first transistor and the gate of the second transistor, and a source terminal of the NMOS is grounded.

In case that the gate DC voltage of the first transistor and the gate DC voltage of the second transistor are low, it is needed to pull up the gate DC voltage of the first transistor and the gate DC voltage of the second transistor, thereby ensuring the stability of the gate DC voltage of the first transistor and the stability of the gate DC voltage of the second transistor. The pull-up implementation process includes: driving the NMOS by using the comparison result, reducing a pull-down capability of the NMOS, thereby increasing the gate DC voltage of the first transistor and the gate DC voltage of the second transistor.

In some applications, a P-type metal-oxide-semiconductor (PMOS) transistor may be used to provide the NMOS with the bias DC current and a load, where a source DC current of the PMOS receives one bias DC current.

In the embodiment of the present disclosure, the adjustment circuit 32 directly controls the conduction degree of the first transistor and the conduction degree of the second transistor by using the comparison result obtained by the detection circuit 31 to adjust the first DC voltage and the second DC voltage. Or, the adjustment circuit 32 pulls up or pulls down the gate DC voltage of the first transistor and the gate DC voltage of the second transistor by using the comparison result obtained by the detection circuit 31 so as to control the conduction degree of the first transistor and the conduction degree of the second transistor to adjust the first DC voltage and the second DC voltage. With both of the above methods, it can be ensured that the drain DC voltage of the first transistor and the drain DC voltage of the second transistor change with each other such that the drain DC voltage of the first transistor is equal to the drain DC voltage of the second transistor in the operation of the bias circuit. When the drain DC voltage of the first transistor is equal to the drain DC voltage of the second transistor, and a gate-to-source DC voltage of the first transistor is equal to a gate-to-source DC voltage of the second transistor, the ratio of the DC current flowing through the first transistor to the DC current flowing through the second transistor is equal to the ratio of the size of the first transistor to the size of the second transistor. Based on the ratio, the first transistor and the second transistor may amplify the input reference DC current of the bias circuit to obtain different bias DC currents, which can improve the control accuracy of the DC current of the bias circuit.

In addition, the second transistor may generate the target output signals having different power levels based on the input signal of the bias circuit by using the bias DC current, which can achieve a more stable performance in terms of power level and linearity.

Second Embodiment

Figure 4:
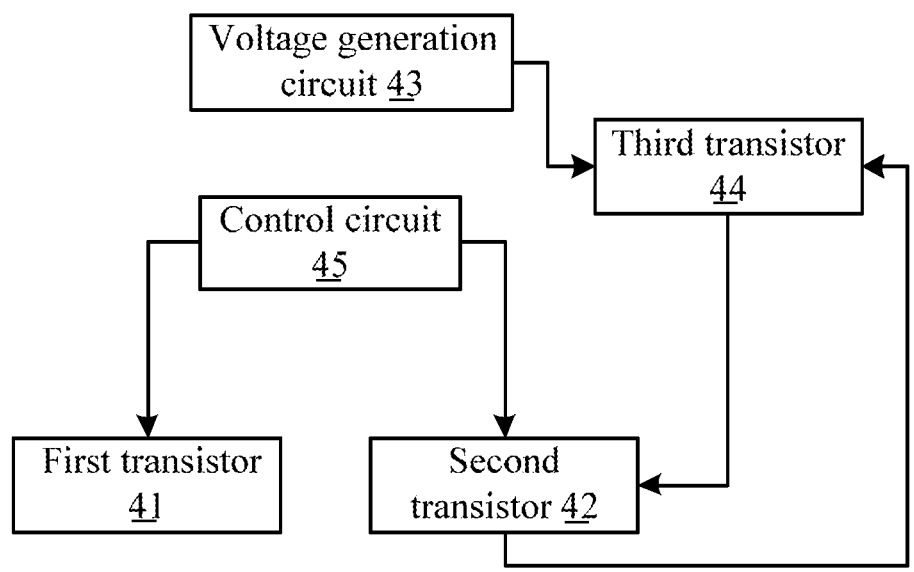
FIG. 4 illustrates a schematic structural diagram of a bias circuit according to a second embodiment of the present disclosure.

A bias circuit is provided in the embodiment. As shown in FIG. 4, the bias circuit includes: a first transistor 41, a second transistor 42, a voltage generation circuit 43, a third transistor 44, and a control circuit 45.

A gate of the first transistor 41 is connected to a gate of the second transistor 42 via a resistor that attenuates an AC signal. The first transistor 41 and the second transistor 42 are configured to amplify an input reference DC current of the bias circuit to obtain a bias DC current. The second transistor generates a target output signal based on an input signal of the bias circuit by using the bias DC current.

The voltage generation circuit 43 is configured to control the third transistor 44 to output the target output signal by using a generated first bias DC voltage matched with a power level, such that the target output signal meets a preset linear relationship.

The preset linear relationship may be that a ratio of a harmonic signal to a baseband signal in the target output signal meets a preset value.

The control circuit 45 has a circuit result shown in FIG. 3. The control circuit 45 includes: a detection circuit 31, configured to compare a first DC voltage with a second DC voltage to obtain a comparison result, where the first DC voltage is a drain DC voltage of the first transistor 41, and the second DC voltage is a drain DC voltage of the second transistor 42; an adjustment circuit 32, configured to adjust the first DC voltage and the second DC voltage by using the comparison result such that the drain DC voltage of the first transistor 41 is equal to the drain DC voltage of the second transistor 42 when the bias circuit is in operation.

In some applications, the input signal of the bias circuit may be a radio frequency input signal. The target output signal of the bias circuit may be radio frequency output signals having different power levels. In case that the power levels of the target output signals are different, a bias circuit is needed to provide different bias DC currents. Here, the first transistor and the second transistor amplify the input reference DC current of the bias circuit by adjusting an input reference DC current of the bias circuit to obtain the bias DC current that meets an actual demand. The second transistor generates the target output signals having different power levels based on the input signal of the bias circuit by using the bias DC current.

In some applications, the bias circuit adjusts a bias state of the first transistor 41 and a bias state of the second transistor 42 by using the control circuit 45. Different bias DC currents are generated by adjusting the input reference DC current in conjunction with the first transistor 41 and the second transistor 42. The second transistor 42 generates the target output signals having different power levels based on the input signal of the bias circuit by using the bias DC current. The bias circuit can achieve a more stable performance in terms of power level and linearity.

Magnitude of an output power generated by the bias circuit relates to factors such as magnitude of the bias current, magnitude of amplitude of the input AC signal and the like.

In some applications, during operation of the bias circuit, when a change of a gate DC voltage of the first transistor 41 causes a change of the drain DC voltage of the first transistor 41 and a change of the drain DC voltage of the second transistor 42, the detection circuit 31 detects the first DC voltage (the drain DC voltage of the first transistor) and the second DC voltage (the drain DC voltage of the second transistor) and compares them to obtain a comparison result. The adjustment circuit 32 controls the gate DC voltage of the first transistor 41 and the gate DC voltage of the second transistor 42 by using the comparison result. The drain DC voltage of the first transistor 41 is achieved to be equal to the drain DC voltage of the second transistor 42 by adjusting an impedance of the first transistor 41 and an impedance of the second transistor 42.

In case that the drain DC voltage of the second transistor 42 changes and the drain DC voltage of the first transistor 41 remains unchanged, the detection circuit 31 detects the first DC voltage (the drain DC voltage of the first transistor) and the second DC voltage (the drain DC voltage of the second transistor) and compares the first DC voltage with the second DC voltage to obtain a comparison result. The adjustment circuit 32 controls the gate DC voltage of the first transistor 41 and the gate DC voltage of the second transistor 42 by using the comparison result. The drain DC voltage of the first transistor 41 changes with a change of the drain DC voltage of the second transistor 42 by adjusting the impedance of the first transistor 41 and the impedance of the second transistor 42, thereby finally ensuring that the drain DC voltage of the first transistor 41 is equal to the drain DC voltage of the second transistor 42.

In some embodiments, the adjustment circuit 32 is specifically configured to control conduction degree of the first transistor 41 and conduction degree of the second transistor 42 by using the comparison result so as to adjust the first DC voltage and the second DC voltage.

The conduction degree indicates that a change of the drain DC voltage of the first transistor 41 and a change of the drain DC voltage of the second transistor 42 are realized by changing the impedance of the first transistor 41 and the impedance of the second transistor 42.

In some embodiments, the adjustment circuit 32 is specifically configured to, by using the comparison result, control a conduction state of the first transistor 41 and a conduction state of the second transistor 42 by pulling up or pulling down the gate DC voltage of the first transistor 41 and the gate DC voltage of the second transistor 42 so as to adjust the first DC voltage and the second DC voltage such that the first DC voltage is equal to the second DC voltage. In some applications, due to influence of a temperature drift, a process drift, or a change in operation conditions, the first DC voltage and the second DC voltage are not equal to each other.

In some embodiments, the voltage generation circuit 43 is specifically configured to generate at least one first bias DC current matched with the power level by using at least one resistor and at least one current source. Each first bias DC voltage controls one third transistor 44 to output the target output signal such that the target output signal meets the preset linear relationship.

Here, the voltage generation circuit 43 may be connected in series via at least one resistor and one current source to form a series circuit. At least one current source is further introduced on a bypass circuit of the series circuit, where one terminal of each of the at least one current source introduced on the bypass circuit is connected to a connection point of the resistors, and another terminal of each of the at least one current source introduced on the bypass circuit is connected to a DC power supply of the bias circuit.

In some applications, in case that the power level of the target output signal outputted by the bias circuit is required to be high, it is needed to increase the DC power supply of the bias circuit. Here, at least one third transistor 44 is needed to increase a withstand voltage, and at least one first bias DC current matched with the power level is generated by using at least one resistor and at least one current source. Each first bias DC voltage controls one third transistor 44, and the target output signal is sequentially inputted from a source terminal of the third transistor 44 and outputted from a drain terminal of the third transistor 44 such that the target output signal meets the preset linear relationship.

In some embodiments, the voltage generation circuit 43 is further configured to generate a second bias DC voltage matched with the power level. The second bias DC voltage is determined as the gate DC voltage of the first transistor 41 and the gate DC voltage of the second transistor 42. The first bias DC voltage and the second bias DC voltage meet a preset condition. The second DC voltage changes with the changes of the first bias DC voltage and second bias DC voltage.

The first bias DC voltage and the second bias DC voltage meet a preset condition, which means that a difference between the first bias DC voltage and the second bias DC voltage may be adjusted by an adjustable resistor and a constant current source. That is, the difference between the first bias DC voltage and the second bias DC voltage is equal to a voltage drop across the adjustable resistor.

There is the at least one third transistor 44, which may meet the withstand voltage when the DC power supply of the bias circuit is increased, and also provide a detection input terminal of the detection circuit 31 with an appropriate DC input voltage range. That is to say, in the operation of the bias circuit, when the target output signals having different power levels are outputted, it is needed to select the appropriate second DC voltage as the DC bias condition of the bias circuit.

In some embodiments, the bias circuit further includes: an inductor and a DC power supply. One terminal of the inductor is connected to the DC power supply, and another terminal of the inductor is connected to a drain of the third transistor 44.

The inductor is configured as an AC load.

The DC power supply is configured to supply power to the bias circuit.

In the embodiment of the present disclosure, in the operation of the bias circuit, when the bias circuit causes a gate-to-source DC voltage of the first transistor 41 and a gate-to-source DC voltage of the second transistor 42 are equal to each other, and causes the drain DC voltage of the first transistor 41 and the drain DC voltage of the second transistor 42 are equal to each other, the ratio of the DC current flowing through the transistor 41 to the DC current flowing through the second transistor 42 is always equal to the ratio of the size of the first transistor 41 to the size of the second transistor 42. And the size of the first transistor 41 and the size of the second transistor 42 (a width of a channel) relate to the process. Therefore, the control accuracy of the DC current may be improved and a more stable performance in terms of power level and linearity may be ensured. The drain DC voltage of the second transistor 42 changes with a change of the first bias DC voltage and a change of the second bias DC voltage. The difference between the first bias DC voltage and the second bias DC voltage is equal to the voltage drop across the adjustable resistor.

The voltage generation circuit 43 generates at least one first bias DC voltage matched with the power level by using the at least one resistor and the at least one current source. Each of the at least one first bias DC voltage controls one third transistor 44. The target output signal is sequentially inputted from the source terminal of the third transistor 44 and outputted from the drain terminal of the third transistor 44, such that the target output signal meets the preset linear relationship and the bias circuit can realize a more stable performance in terms of power level and linearity, and the debugging can be more flexible.

When the second bias DC voltage changes due to the influence of the temperature, the adjustment circuit 32 can still ensure that the drain DC voltage of the first transistor 41 is equal to the drain DC voltage of the second transistor 42. Therefore, the influence of the temperature can be offset.

Third Embodiment

The embodiment is a specific application example of a circuit shown in FIG. 4.

Figure 5:
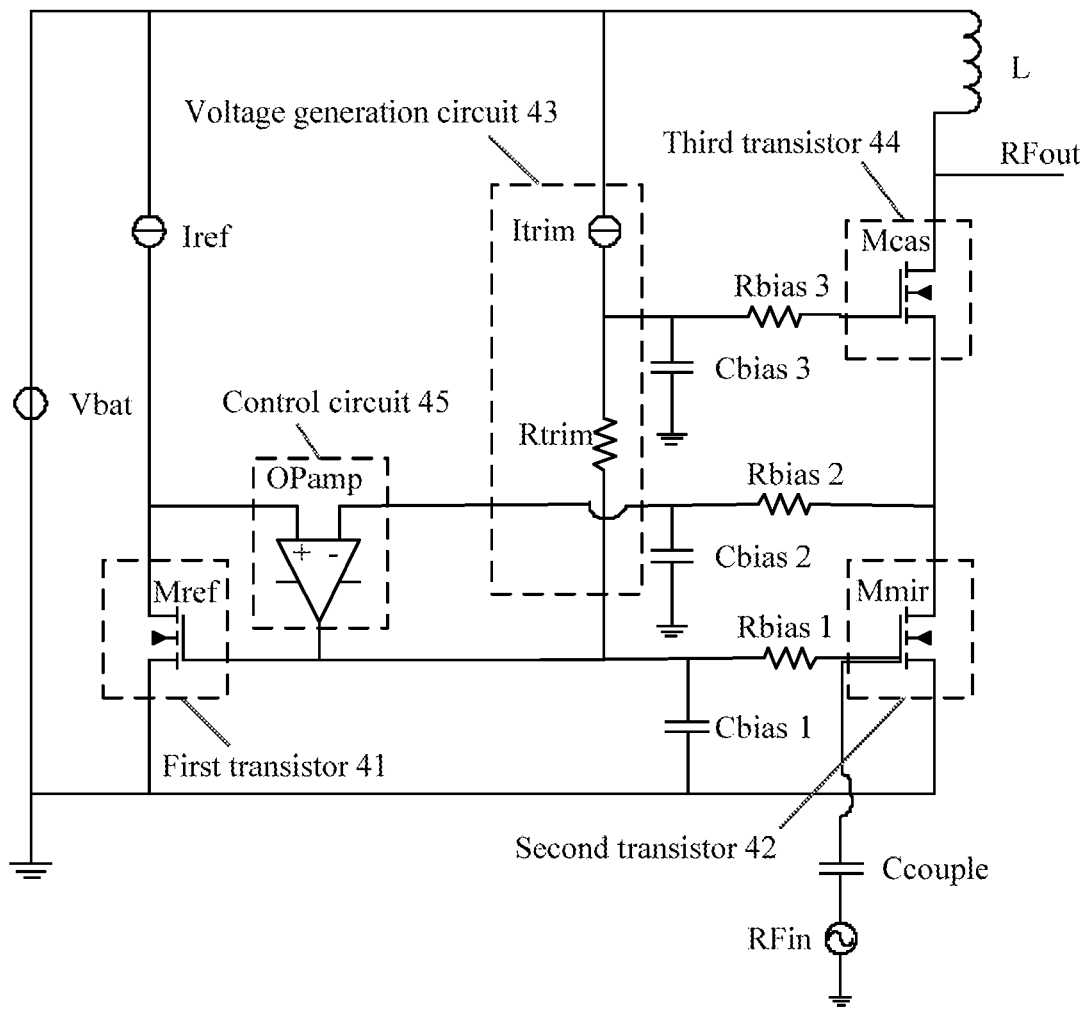
FIG. 5 illustrates a schematic structural diagram of a bias circuit according to a third embodiment of the present disclosure.

In the embodiment, as shown in FIG. 5, a bias circuit 51 includes: a NMOS transistor Mref, a NMOS transistor Mmir, a NMOS transistor Mcas, an operational amplifier OPamp, a DC current source Iref, a DC current source Itrim, a resistor Rtrim, a resistor Rbias1, a capacitor Cbias1, a resistor Rbias2, a capacitor Cbias2, a resistor Rbias3, a capacitor Cbias3, an inductor L, a DC power supply Vbat, an input AC signal RFin, an output power RFout. A gate of the NMOS transistor Mref is connected to a gate of the NMOS transistor Mmir via the resistor Rbias1 that attenuates the small AC input signal RFin. A drain terminal of the NMOS transistor Mref is connected to a non-inverting input terminal of the operational amplifier OPamp. A drain terminal of the NMOS transistor Mmir is connected to an inverting input terminal of the operational amplifier OPamp via the resistor Rbias2. The NMOS transistor Mref is connected to the DC current source Iref. The drain of the NMOS transistor Mmir is connected to a source terminal of the NMOS transistor Mcas. The resistor Rbias1, the capacitor Cbias1, the resistor Rbias2, the capacitor Cbias2, the resistor Rbias3, and the capacitor Cbias3 constitute a low-pass filter that is configured to acquire a DC signal.

The first transistor 41 is the NMOS transistor Mref,

The second transistor 42 is the NMOS transistor Mmir.

The voltage generation circuit 43 includes: the DC current source Itrim and the resistor Rtrim.

The third transistor 44 is the NMOS transistor Mcas.

The control circuit 45 includes the operational amplifier OPamp.

An operation principle of the bias circuit shown in FIG. 5 is as follows.

A bias state of the NMOS transistor Mref and a bias state of the NMOS transistor Mmir are adjusted by the operational amplifier OPamp. Different bias DC currents can be obtained by adjusting amplitude of the DC current source Iref. The NMOS transistor Mmir may generates target output signals having different power levels by using the bias DC current and the input AC signal RFin.

A specific process of adjusting the bias state of the NMOS transistor Mref and the bias state of the NMOS transistor Mmir by the operational amplifier OPamp includes the following operations.

In operation of the input AC signal RFin and the bias circuit, since an impedance of the DC current source Iref is much greater than an impedance of source terminal of the NMOS transistor Mcas, therefore a total impedance of drain terminal of the NMOS transistor Mref is greater than a total impedance of drain terminal of the NMOS transistor Mmir. Therefore, a gain of a negative feedback loop is greater than a gain of a positive feedback loop, and the circuit as a whole is a negative feedback system. The negative feedback loop includes: an input terminal of the operational amplifier OPamp connected to the drain terminal of the NMOS transistor Mref, the operational amplifier OPamp, the gate of the NMOS transistor Mref, the NMOS transistor Mref, and the drain terminal of the NMOS transistor Mref. The positive feedback loop includes: an input terminal of the operational amplifier OPamp connected to the drain terminal of the NMOS transistor Mmir, the operational amplifier OPamp, the gate of the NMOS transistor Mmir, the NMOS transistor Mmir, and the drain terminal of the NMOS transistor Mref. The negative feedback system includes the negative feedback loop and the positive feedback loop.

When the second DC voltage (a drain DC voltage of the NMOS transistor Mmir) is higher than the first DC voltage (a drain DC voltage of the NMOS transistor Mref), a gate DC voltage of the NMOS transistor Mref and a gate DC voltage of the NMOS Mmir may be decreased by the operational amplifier OPamp, such that the drain DC voltage of the NMOS transistor Mref and the drain DC voltage of the NMOS transistor Mmir are increased, but the drain DC voltage of the NMOS transistor Mref is increased more, such that the drain DC voltage of the NMOS transistor Mref and the drain DC voltage of the NMOS transistor Mmir tend to be equal to each other. When the second DC voltage (the drain DC voltage of the NMOS transistor Mmir) is lower than the first DC voltage (the drain DC voltage of the NMOS transistor Mref), the gate DC voltage of the NMOS transistor Mref and the gate DC voltage of the NMOS transistor Mmir may be increased by the operational amplifier OPamp, such that the drain DC voltage of the NMOS transistor Mref and the drain DC voltage of the NMOS transistor Mmir are decreased, but the drain DC voltage of the NMOS transistor Mref is decreased more, such that the drain DC voltage of the NMOS transistor Mref and the drain DC voltage of the NMOS transistor Mmir tend to be equal to each other.

In adjustment of the resistor Rtrim or the Itrim, the drain DC voltage of the NMOS transistor Mmir changes and a difference between the drain DC voltage of the NMOS transistor Mref and the drain DC voltage of the NMOS transistor Mmir may be generated. When the drain DC voltage of the NMOS transistor Mmir is higher than the drain DC voltage of the NMOS transistor Mref, the gate DC voltage of the NMOS transistor Mref and the gate DC voltage of the NMOS transistor Mmir may be decreased by the operational amplifier OPamp, such that the drain DC voltage of the NMOS transistor Mref and the drain DC voltage of the NMOS transistor Mmir are increased, but the drain DC voltage of the NMOS transistor Mref is increased more. When the drain DC voltage of the NMOS transistor Mmir is lower than the drain DC voltage of the NMOS transistor Mref, the gate DC voltage of the NMOS transistor Mref and the gate DC voltage of the NMOS transistor Mmir may be increased by the operational amplifier OPamp, such that the drain DC voltage of the NMOS transistor Mref and the drain DC voltage of the NMOS transistor Mmir are decreased, but the drain DC voltage of the NMOS transistor Mref is decreased more. Finally, with the negative feedback system, the drain DC voltage of the NMOS transistor Mref and the drain DC voltage of the NMOS transistor Mmir tend to be equal to each other.

When the gate-to-source DC voltage of the NMOS transistor Mref and the gate-to-source DC voltage of the NMOS transistor Mmir are equal to each other, and the drain DC voltage of the NMOS transistor Mref and the drain DC voltage of the NMOS transistor Mmir are equal to each other, the DC current flowing through the NMOS transistor Mmir is equal to the value of Iref multiplied by the ratio of the size of the NMOS transistor Mref to the size of the NMOS transistor Mmir. The DC current flowing through the NMOS transistor Mmir is the bias DC current in operation of the bias circuit.

In the embodiment of the present disclosure, the voltage generation circuit 43 generates a first bias DC voltage at the gate of the Mcas and a second bias DC voltage at the gates of Mref and Mmir by using one DC current source Itrim and one resistor Rtrim. A difference between the first bias DC voltage and the second bias DC voltage is a voltage across the resistor Rtrim. The gate of the Mcas is filtered by the resistor Rbias3 and the capacitor Cbias3, and connected to the resistor Rtrim. A gate-to-source DC voltage of the Mcas is subtracted from the first bias DC voltage to obtain the drain voltage of Mmir (the second DC voltage). The second DC voltage changes with the changes of the first bias DC voltage and second bias DC voltage.

Here, the voltage generation circuit 43 may further generate the first bias DC voltage and the second bias DC voltage with the methods provided in the fourth embodiment and the fifth embodiment.

In the embodiment of the present disclosure, in the operation of the bias circuit, the hardware programmable DC current source Itrim and the resistor Rtrim are utilized to generate an adjustment voltage Vtrim which is expressed by the formula: $Vtrim=Itrim\times Rtrim$, such that there is a controllable voltage Vtrim of the gate of the NMOS transistor Mcas with respect to the gate of the NMOS transistor Mmir, thereby controlling the drain DC voltage of the NMOS transistor Mref and the drain DC voltage of the NMOS transistor Mmir. In this case, the drain DC voltage of the NMOS transistor Mref and the drain DC voltage of the NMOS transistor Mmir follow with each other, thereby further greatly improving the control accuracy of the DC current of the bias circuit.

Since a voltage at one terminal of the resistor Rtrim is equal to the gate DC voltage of the NMOS transistor Mref, the DC current flowing through the resistor Rtrim is absorbed by an output terminal of the operational amplifier OPamp. Here, one terminal of the resistor Rtrim may be connected to the gate of the NMOS transistor Mref, or a resistor without the DC current may be connected to the gate of the NMOS transistor Mref. Thus, a difference between the gate voltage of the NMOS transistor Mcas and the gate voltage of the NMOS transistor Mref and a difference between the gate voltage of the NMOS transistor Mcas and the gate voltage of the NMOS transistor Mmir are only determined by the resistor Rtrim and the DC current source Itrim, such that the debugging is more convenient.

The hardware-programmable DC current source Itrim and the DC current source Iref are used to adjust the bias state of the NMOS transistor Mref and the bias state of the NMOS transistor Mmir in the bias circuit. Preferred bias DC currents and preferred bias DC voltages can be selected for different power levels such that the bias circuit can realize a better performance in terms of power level, efficiency and linearity.

Fourth Embodiment

The embodiment is a specific application example of a circuit shown in FIG. 4.

Figure 6:
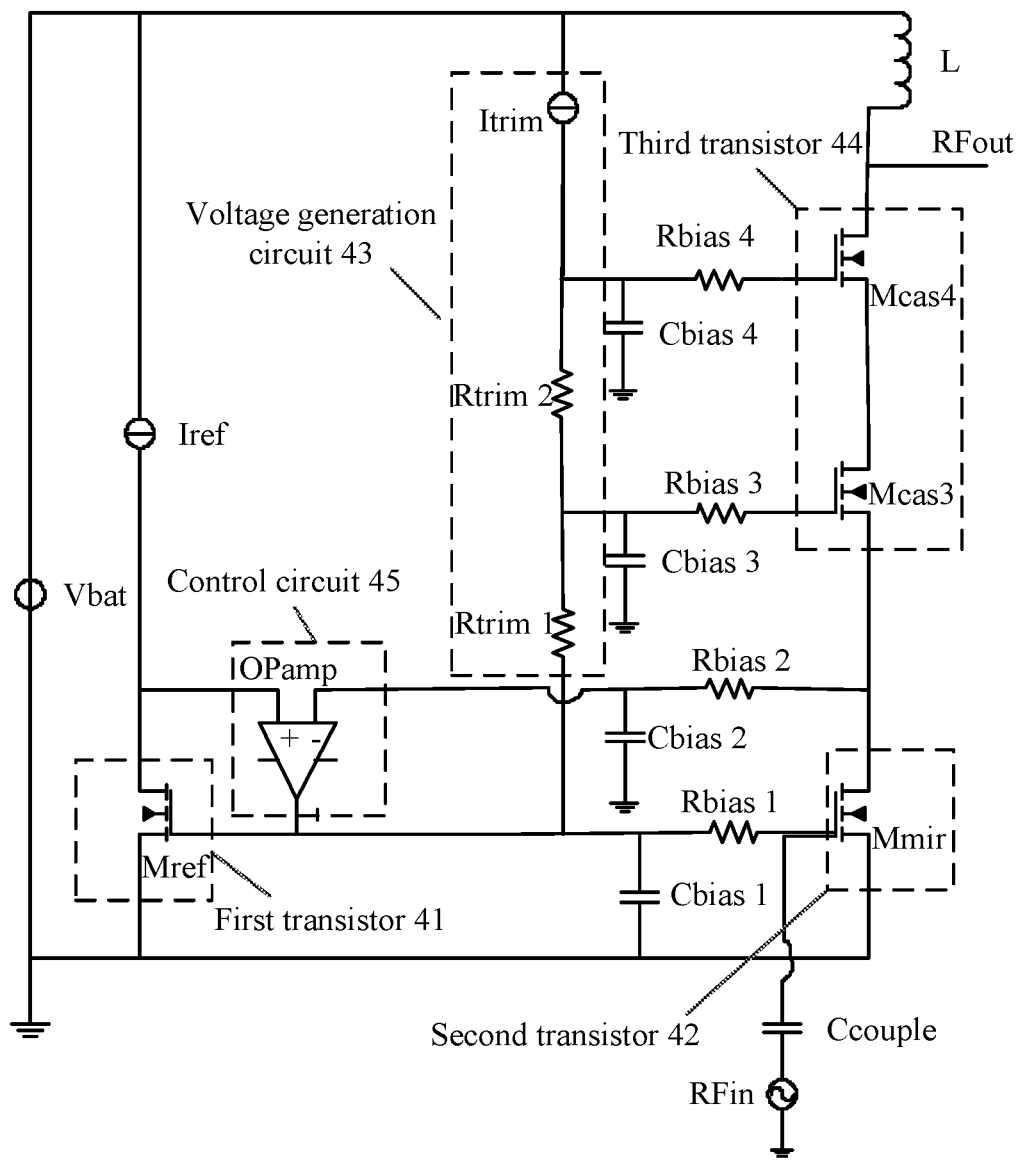
FIG. 6 illustrates a schematic structural diagram of a bias circuit according to a fourth embodiment of the present disclosure.

In the embodiment, as shown in FIG. 6, the bias circuit includes: a NMOS transistor Mref, a NMOS transistor Mmir, a NMOS transistor Mcas3, a NMOS transistor Mcas4, an operational amplifier OPamp, a DC current source Iref, a DC current source Itrim, a resistor Rtrim1, a resistor Rtrim2, a resistor Rbias1, a capacitor Cbias1, a resistor Rbias2, a capacitor Cbias2, a resistor Rbias3, a capacitor Cbias3, a resistor Rbias4, a capacitor Cbias4, an inductor L, a DC power supply Vbat, an input AC signal RFin, an output terminal RFout. A drain terminal of the NMOS transistor Mref is connected to a non-inverting input terminal of the operational amplifier OPamp, a drain terminal of the NMOS transistor Mmir is connected to an inverting input terminal of the operational amplifier OPamp via the resistor Rbias2.

The first transistor 41 is the NMOS transistor Mref;

The second transistor 42 is the NMOS transistor Mmir;

The voltage generation circuit 43 includes: the DC current source Itrim, the resistor Rtrim1 and the resistor Rtrim2.

The third transistor 44 includes the NMOS transistor Mcas3 and the NMOS transistor Macs4.

The control circuit 45 includes the operational amplifier OPamp.

An operation principle of a bias circuit shown in FIG. 6 is as follows.

A bias state of the NMOS transistor Mref and a bias state of the NMOS transistor Mmir are adjusted by the operational amplifier OPamp. Different bias DC currents can be obtained by adjusting amplitude of the DC current source Iref. The NMOS transistor Mmir may generate target output signals having different power levels by using the bias DC current and the input AC signal RFin.

A specific process of adjusting the bias state of the NMOS transistor Mref and the bias state of the NMOS transistor Mmir by the operational amplifier OPamp includes the following operations.

In operation of the input AC signal RFin and bias circuit, since an impedance of the DC current source Iref is much greater than an impedance of source terminal of the NMOS transistor Mcas, a total impedance of drain terminal the NMOS transistor Mref is greater than a total impedance of drain terminal of the NMOS transistor Mmir. Therefore, a gain of a negative feedback loop is greater than a gain of a positive feedback loop, and the circuit as a whole is a negative feedback system. The negative feedback loop includes: an input terminal of the operational amplifier OPamp connected to the drain terminal of the NMOS transistor Mref, the operational amplifier OPamp, a gate of the NMOS transistor Mref, the NMOS transistor Mref, and the drain terminal of the NMOS transistor Mref. The positive feedback loop includes: an input terminal of the operational amplifier OPamp connected to the drain terminal of the NMOS transistor Mmir, the operational amplifier OPamp, a gate of the NMOS transistor Mmir, the NMOS transistor Mmir, and the drain terminal of the NMOS transistor Mref. The negative feedback system includes the negative feedback loop and the positive feedback loop.

When the second DC voltage (a drain DC voltage of the NMOS transistor Mmir) is higher than the first DC voltage (a drain DC voltage of the NMOS transistor Mref), a gate DC voltage of the NMOS transistor Mref and a gate DC voltage of the NMOS Mmir are decreased by the operational amplifier OPamp, such that the drain DC voltage of the NMOS transistor Mref and the drain DC voltage of the NMOS transistor Mmir may be increased, but the drain DC voltage of the NMOS transistor Mref is increased more, such that the drain DC voltage of the NMOS transistor Mref and the drain DC voltage of the NMOS transistor Mmir tend to be equal to each other. When the second DC voltage (the drain DC voltage of the NMOS transistor Mmir) is lower than the first DC voltage (the drain DC voltage of the NMOS transistor Mref), the gate DC voltage of the NMOS transistor Mref and the gate DC voltage of the NMOS transistor Mmir may be increased by the operational amplifier OPamp, such that the drain DC voltage of the NMOS transistor Mref and the drain DC voltage of the NMOS transistor Mmir are decreased, but the drain DC voltage of the NMOS transistor Mref is decreased more, such that the drain DC voltage of the NMOS transistor Mref and the drain DC voltage of the NMOS transistor Mmir tend to be equal to each other.

In adjustment of the resistor Rtrim or the Itrim, the drain DC voltage of the NMOS transistor Mmir changes and a difference between the drain DC voltage of the NMOS transistor Mref and the drain DC voltage of the NMOS transistor Mmir may be generated. When the drain DC voltage of the NMOS transistor Mmir is higher than the drain DC voltage of the NMOS transistor Mref, the gate DC voltage of the NMOS transistor Mref and the gate DC voltage of the NMOS transistor Mmir may be decreased by the operational amplifier OPamp, such that the drain DC voltage of the NMOS transistor Mref and the drain DC voltage of the NMOS transistor Mmir are increased, but the drain DC voltage of the NMOS transistor Mref is increased more. When the drain DC voltage of the NMOS transistor Mmir is lower than the drain DC voltage of the NMOS transistor Mref, the gate DC voltage of the NMOS transistor Mref and the gate DC voltage of the NMOS transistor Mmir may be increased by the operational amplifier OPamp, such that the drain DC voltage of the NMOS transistor Mref and the drain DC voltage of the NMOS transistor Mmir are decreased, but the drain DC voltage of the NMOS transistor Mref is decreased more. Finally, with the negative feedback system, the drain DC voltage of the NMOS transistor Mref and the drain DC voltage of the NMOS transistor Mmir tend to be equal to each other.

The DC current source Itrim, the resistor Rtrim1, and the resistor Rtrim2 are used to generate a first bias DC voltage at a gate of the NMOS transistor Mcas3 and a gate of the NMOS transistor Mcas4, and generate a second bias DC voltage at the gate of the NMOS transistor Mref and the gate of the NMOS transistor Mmir. A difference between the first bias DC voltage and the second bias DC voltage is a sum of a voltage of the resistor Rtrim1 and a voltage of the resistor Rtrim2.

A gate-to-source DC voltage of the NMOS transistor Mcas3 and a gate-to-source DC voltage of the NMOS transistor Macs4 are subtracted from the first bias DC voltage at the gate of the NMOS transistor Mcas4 to obtain the drain DC voltage of the NMOS transistor Mmir (the second DC voltage in the first embodiment). The second DC voltage changes with changes of the first bias DC voltage and second bias DC voltage.

Fifth Embodiment

The embodiment is a specific application example of a circuit shown in FIG. 4.

Figure 7:
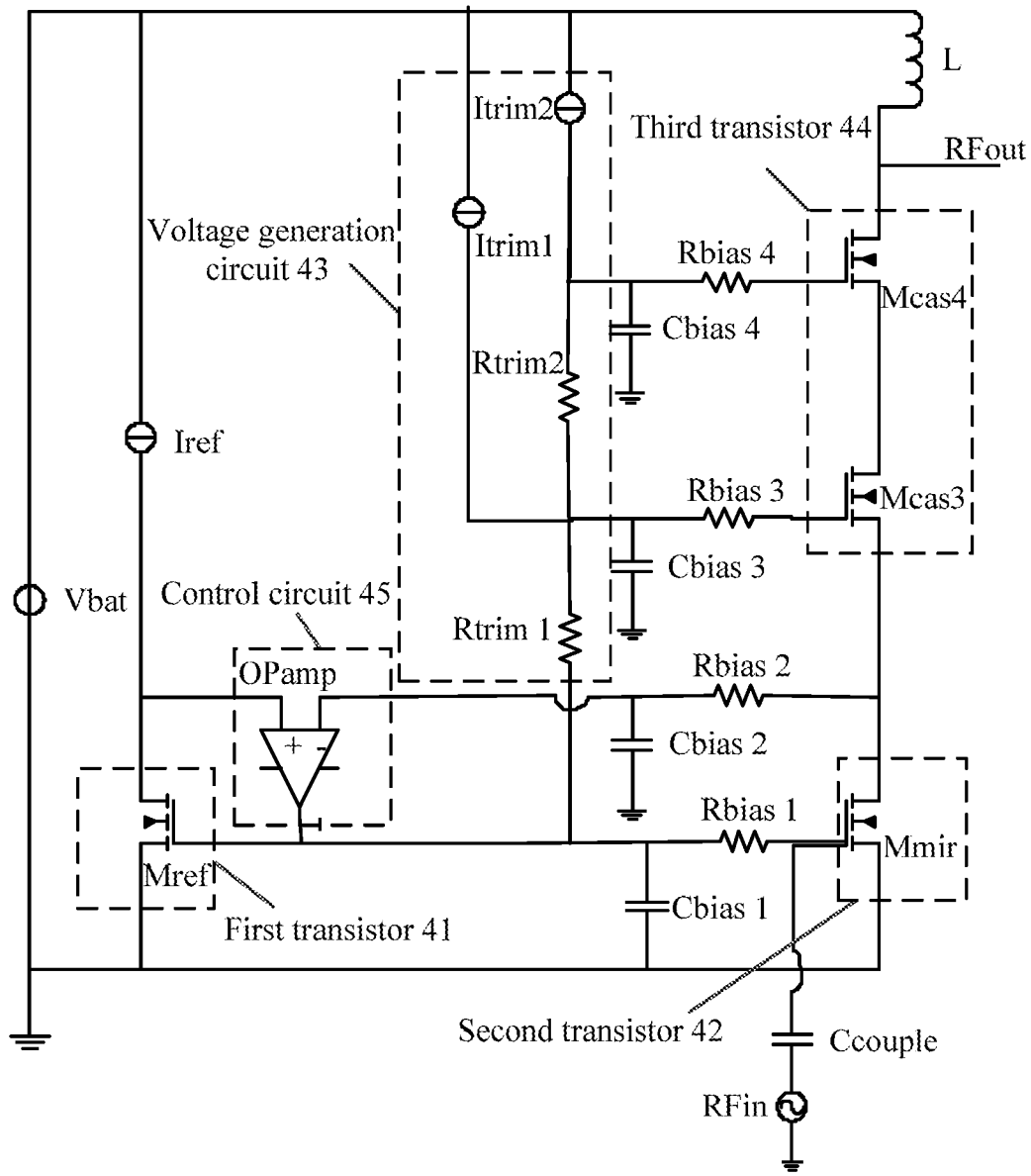
FIG. 7 illustrates a schematic structural diagram of a bias circuit according to a fifth embodiment of the present disclosure.

In the embodiment, as shown in FIG. 7, the bias circuit includes: an NMOS transistor Mref, an NMOS transistor Mmir, an NMOS transistor Mcas3, an NMOS transistor Mcas4, an operational amplifier OPamp, a DC current source Iref, and a DC current source Itrim1, a DC current source Itrim2, a resistor Rtrim1, a resistor Rtrim2, a resistor Rbias1, a capacitor Cbias1, a resistor Rbias2, a capacitor Cbias2, a resistor Rbias3, a capacitor Cbias3, a resistor Rbias4, a capacitor Cbias4, an inductor L, a DC power supply Vbat, an input AC signal RFin, and an output RFout. A drain terminal of the NMOS transistor Mref is connected to a non-inverting input terminal of the operational amplifier OPamp, and a drain terminal of the NMOS transistor Mmir is connected to an inverting input terminal of the operational amplifier OPamp via the resistor Rbias2.

The first transistor 41 is the NMOS transistor Mref.

The second transistor 42 is the NMOS transistor Mmir.

The voltage generation circuit 43 includes: the DC current source Itrim1, the DC current source Itrim2, the resistor Rtrim1 and the resistor Rtrim2.

The third transistor 44 includes the NMOS transistor Mcas3 and the NMOS transistor Macs4.

The control circuit 45 includes the operational amplifier OPamp.

An operation principle of a bias circuit shown in FIG. 7 is as follows.

A bias state of the NMOS transistor Mref and a bias state of the NMOS transistor Mmir are adjusted by the operational amplifier OPamp. Different bias DC currents can be obtained by adjusting magnitude of the DC current source Iref. The NMOS transistor Mmir may generate target output signals having different power levels by using the bias DC current and the input AC signal RFin.

A specific process of adjusting the bias state of the NMOS transistor Mref and the bias state of the NMOS transistor Mmir by the operational amplifier OPamp includes the following operations.

In operation of the input AC signal RFin and the bias circuit, since an impedance of the DC current source Iref is much greater than an impedance of source terminal of the NMOS transistor Mcas, a total impedance of drain terminal of the NMOS transistor Mref is greater than a total impedance of drain terminal of the NMOS transistor Mmir. Therefore, a gain of a negative feedback loop is greater than a gain of a positive feedback loop, and the circuit as a whole is a negative feedback system. The negative feedback loop includes: an input terminal of the operational amplifier OPamp connected to the drain terminal of the NMOS transistor Mref, the operational amplifier OPamp, a gate of the NMOS transistor Mref, the NMOS transistor Mref, and the drain terminal of the NMOS transistor Mref. The positive feedback loop includes: an input terminal of the operational amplifier OPamp connected to the drain terminal of the NMOS transistor Mmir, the operational amplifier OPamp, a gate of the NMOS transistor Mmir, the NMOS transistor Mmir, and the drain terminal of the NMOS transistor Mmir. The negative feedback system includes the negative feedback loop and the positive feedback loop.

When the second DC voltage (a drain DC voltage of the NMOS transistor Mmir) is higher than the first DC voltage (a drain DC voltage of the NMOS transistor Mref), a gate DC voltage of the NMOS transistor Mref and a gate DC voltage of the NMOS Mmir may be decreased by the operational amplifier OPamp, such that the drain DC voltage of the NMOS transistor Mref and the drain DC voltage of the NMOS transistor Mmir are increased, but the drain DC voltage of the NMOS transistor Mref is increased more, such that the drain DC voltage of the NMOS transistor Mref and the drain DC voltage of the NMOS transistor Mmir tend to be equal to each other. When the second DC voltage (the drain DC voltage of the NMOS transistor Mmir) is lower than the first DC voltage (the drain DC voltage of the NMOS transistor Mref), the gate DC voltage of the NMOS transistor Mref and the gate DC voltage of the NMOS transistor Mmir may be increased by the operational amplifier OPamp, such that the drain DC voltage of the NMOS transistor Mref and the drain DC voltage of the NMOS transistor Mmir are decreased, but the drain DC voltage of the NMOS transistor Mref is decreased more, such that the drain DC voltage of the NMOS transistor Mref and the drain DC voltage of the NMOS transistor Mmir tend to be equal to each other.

In adjustment of the resistor Rtrim or the Itrim, the drain DC voltage of the NMOS transistor Mmir changes and a difference between the drain DC voltage of the NMOS transistor Mref and the drain DC voltage of the NMOS transistor Mmir may be generated. When the drain DC voltage of the NMOS transistor Mmir is higher than the drain DC voltage of the NMOS transistor Mref, the gate DC voltage of the NMOS transistor Mref and the gate DC voltage of the NMOS transistor Mmir may be decreased by the operational amplifier OPamp, such that the drain DC voltage of the NMOS transistor Mref and the drain DC voltage of the NMOS transistor Mmir are increased, but the drain DC voltage of the NMOS transistor Mref is increased more. When the drain DC voltage of the NMOS transistor Mmir is lower than the drain DC voltage of the NMOS transistor Mref, the gate DC voltage of the NMOS transistor Mref and the gate DC voltage of the NMOS transistor Mmir may be increased by the operational amplifier OPamp, such that the drain DC voltage of the NMOS transistor Mref and the drain DC voltage of the NMOS transistor Mmir are decreased, but the drain DC voltage of the NMOS transistor Mref is decreased more. Finally, with the negative feedback system, the drain DC voltage of the NMOS transistor Mref and the drain DC voltage of the NMOS transistor Mmir tend to be equal to each other.

One first bias DC voltage is generated at the NMOS transistor Mcas3 by using the DC current source Itrim1 and the resistor Rtrim1. Another first bias DC voltage is generated at the gate of the NMOS transistor Mcas4 by using the DC current source Itrim2, the resistor Rtrim1, and the resistor Rtrim2. A second bias DC voltage is generated at the gate of the NMOS transistor Mref and at the gate of the NMOS transistor Mmir. The NMOS transistor Mcas3 and the NMOS transistor Mcas4 are respectively controlled by each of the first bias DC voltages, thereby debugging the gate DC voltage of the NMOS transistor Mcas3 and the gate DC voltage of the NMOS transistor Mcas4 respectively.

Therefore, the debugging is more flexible.

A gate-to-source DC voltage of the NMOS transistor Mcas3 and a gate-to-source DC voltage of the NMOS transistor Macs4 are subtracted from the first bias DC voltage at the gate of the NMOS transistor Mcas4 to obtain the drain DC voltage of the NMOS transistor Mmir (the second DC voltage in the first embodiment). The second DC voltage changes with changes of the first bias DC voltage and second bias DC voltage.

Sixth Embodiment

The embodiment is a specific application example of a circuit shown in FIG. 4.

Figure 8:
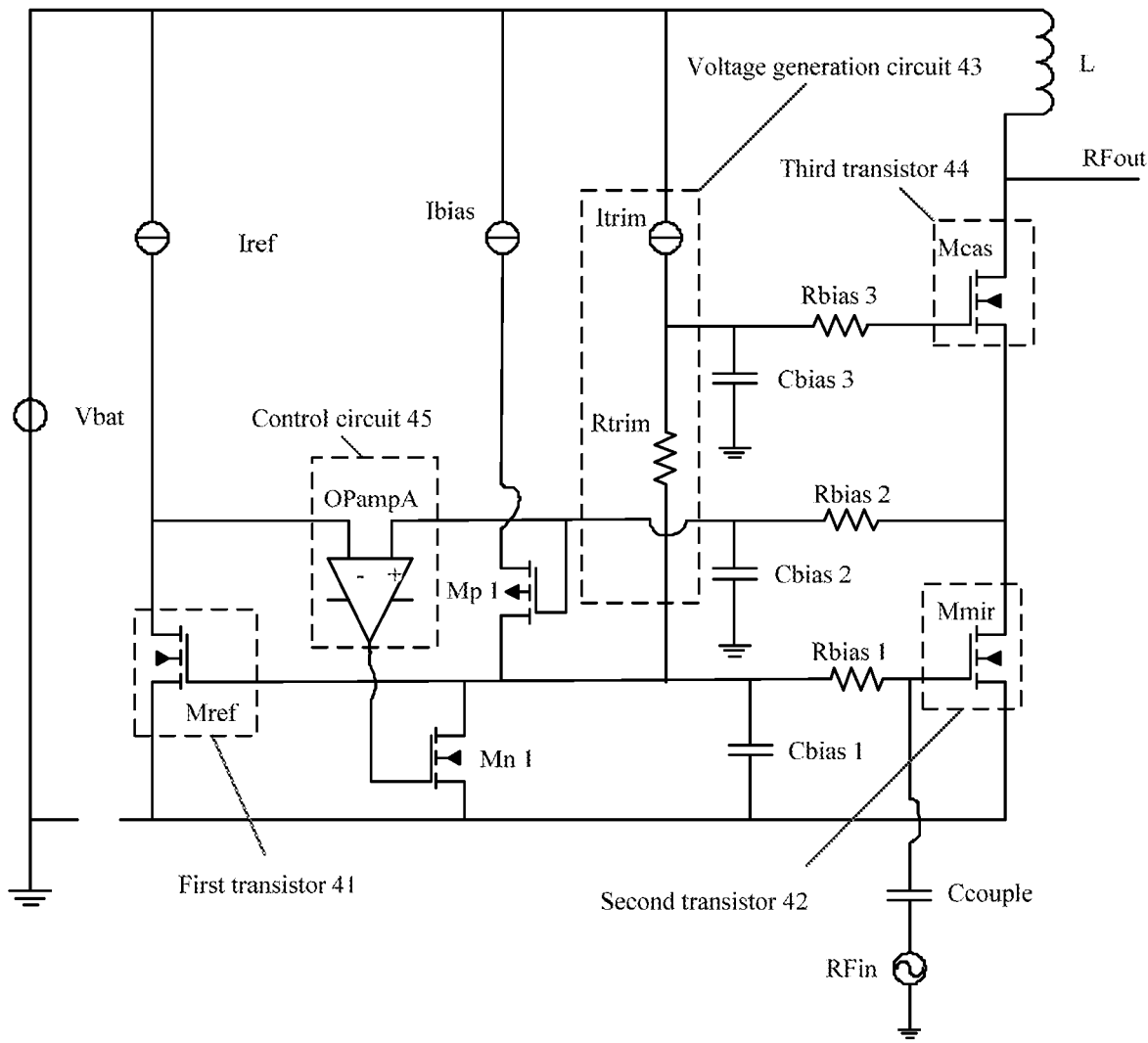
FIG. 8 illustrates a schematic structural diagram of a bias circuit according to a sixth embodiment of the present disclosure.

In the embodiment, as shown in FIG. 8, the bias circuit 81 includes: an NMOS transistor Mref, an NMOS transistor Mmir, an NMOS transistor Mcas, an operational amplifier OPampA, a DC current source Iref, and a DC current source Itrim, a resistor Rtrim, a resistor Rbias1, a capacitor Cbias1, a resistor Rbias2, a capacitor Cbias2, a resistor Rbias3, a capacitor Cbias3, a NMOS transistor Mn1, a PMOS transistor Mp1, an inductor L, a DC power supply Vbat, an input AC signal RFin, an output RFout. A drain terminal of the NMOS transistor Mref is connected to a non-inverting input terminal of the operational amplifier OPampA, and a drain terminal of the NMOS transistor Mmir is connected to an inverting input terminal of the operational amplifier OPampA via the resistor Rbias2.

The first transistor 41 is the NMOS transistor Mref;

The second transistor 42 is the NMOS transistor Mmir;

The voltage generation circuit 43 includes: the DC current source Itrim, the resistor Rtrim.

The third transistor 44 is the NMOS transistor Mcas.

The control circuit 45 includes the operational amplifier OPampA.

An operation principle of a bias circuit shown in FIG. 8 is as follows.

In operation of the input AC signal RFin or the bias circuit, due to an influence of the temperature or other factors, when a gate DC voltage of at least one of the NMOS transistor Mref and the NMOS transistor Mmir changes, a conduction state of the NMOS transistor Mref and a conduction state of the NMOS transistor Mmir are controlled by pulling up or pulling down the gate DC voltage of the NMOS transistor Mref and the gate DC voltage of the NMOS transistor Mmir by using a comparison result outputted by an output terminal of the operational amplifier OPamp so as to adjust the first DC voltage and the second DC voltage to equalize them.

In case that the gate DC voltage of the NMOS transistor Mref and the gate DC voltage of the NMOS transistor Mmir are high, it is needed to pull down the gate DC voltage of the NMOS transistor Mref and the gate DC voltage of the NMOS transistor Mmir, thereby ensuring the stability of the gate DC voltage of the NMOS transistor Mref and the gate DC voltage of the NMOS transistor Mmir. An implementation process of the pull-down includes: driving the NMOS transistor Mn1 with the comparison result outputted by the operational amplifier OPamp. Since a source terminal of the NMOS transistor Mn1 is grounded, the gate DC voltage of the NMOS transistor Mref and the gate DC voltage of the NMOS transistor Mmir may be pulled down.

In case that the gate DC voltage of the NMOS transistor Mref and the gate DC voltage of the NMOS transistor Mmir are low, it is needed to pull up the gate DC voltage of the NMOS transistor Mref and the gate DC voltage of the NMOS transistor Mmir, thereby ensuring the stability of the gate DC voltage of the NMOS transistor Mref and the gate DC voltage of the NMOS transistor Mmir. An implementation process of the pull-up includes: driving the NMOS transistor Mn1 with the comparison result to reduce a pull-down capability of the NMOS transistor Mn1, thereby increasing the gate DC voltage of the NMOS transistor Mref and the gate DC voltage of the NMOS transistor Mmir. The PMOS transistor Mp1 provides a bias DC current and a load to the NMOS transistor Mn1. A source DC current of the PMOS transistor Mp1 receives one bias DC current Ibias.

In operation of the input AC signal RFin and the bias circuit, since an impedance of the DC current source Iref is much greater than an impedance of source terminal of the NMOS transistor Mcas, a total impedance of drain terminal of the NMOS transistor Mref is greater than a total impedance of drain terminal of the NMOS transistor Mmir. Therefore, a gain of a negative feedback loop is greater than a gain of a positive feedback loop, and the circuit as a whole is a negative feedback system. The negative feedback loop includes: an input terminal of the operational amplifier OPampA connected to the drain terminal of the NMOS transistor Mref, the operational amplifier OPampA, a gate of the NMOS transistor Mn1, a drain terminal of the NMOS transistor Mn1, a gate of the NMOS transistor Mref, the NMOS transistor Mref, and the drain terminal of the NMOS transistor Mref. A positive feedback loop includes: an input terminal of the operational amplifier OPampA connected to the drain terminal of the NMOS transistor Mmir, the operational amplifier OPampA, a gate of the NMOS transistor Mn1, a drain terminal of the NMOS transistor Mn1, a gate of the NMOS transistor Mmir, the NMOS transistor Mmir, and the drain terminal of the NMOS transistor Mmir. The negative feedback system includes the negative feedback loop and the positive feedback loop.

When the second DC voltage (a drain DC voltage of the NMOS transistor Mmir) is higher than the first DC voltage (a drain DC voltage of the NMOS transistor Mref), a gate DC voltage of the NMOS transistor Mref and a gate DC voltage of the NMOS Mmir are decreased by the operational amplifier OPampA, such that the drain DC voltage of the NMOS transistor Mref and the drain DC voltage of the NMOS transistor Mmir are increased, but the drain DC voltage of the NMOS transistor Mref is increased more, such that the drain DC voltage of the NMOS transistor Mref and the drain DC voltage of the NMOS transistor Mmir tend to be equal to each other. When the second DC voltage (the drain DC voltage of the NMOS transistor Mmir) is lower than the first DC voltage (the drain DC voltage of the NMOS transistor Mref), the gate DC voltage of the NMOS transistor Mref and the gate DC voltage of the NMOS transistor Mmir may be increased by the operational amplifier OPampA, such that the drain DC voltage of the NMOS transistor Mref and the drain DC voltage of the NMOS transistor Mmir are decreased, but the drain DC voltage of the NMOS transistor Mref is decreased more, such that the drain DC voltage of the NMOS transistor Mref and the drain DC voltage of the NMOS transistor Mmir tend to be equal to each other.

In adjustment of the resistor Rtrim or the Itrim, the drain DC voltage of the NMOS transistor Mmir changes and a difference between the drain DC voltage of the NMOS transistor Mref and the drain DC voltage of the NMOS transistor Mmir may be generated. When the drain DC voltage of the NMOS transistor Mmir is higher than the drain DC voltage of the NMOS transistor Mref, the gate DC voltage of the NMOS transistor Mref and the gate DC voltage of the NMOS transistor Mmir may be decreased by the operational amplifier OPampA, such that the drain DC voltage of the NMOS transistor Mref and the drain DC voltage of the NMOS transistor Mmir are increased, but the drain DC voltage of the NMOS transistor Mref is increased more. When the drain DC voltage of the NMOS transistor Mmir is lower than the drain DC voltage of the NMOS transistor Mref, the gate DC voltage of the NMOS transistor Mref and the gate DC voltage of the NMOS transistor Mmir may be increased by the operational amplifier OPampA, such that the drain DC voltage of the NMOS transistor Mref and the drain DC voltage of the NMOS transistor Mmir are decreased, but the drain DC voltage of the NMOS transistor Mref is decreased more. Finally, with the negative feedback system, the drain DC voltage of the NMOS transistor Mref and the drain DC voltage of the NMOS transistor Mmir tend to be equal to each other.

The first bias DC voltage is generated at the gate of the NMOS transistor Mcas by using the DC current source Itrim and the resistor Rtrim. The second bias DC voltage is generated at the gate of the NMOS transistor Mref and at the gate of the NMOS transistor Mmir by using the DC current source Itrim and the resistor Rtrim. A difference between the first bias DC voltage and the second bias DC voltage is a voltage across the resistor Rtrim. A gate-to-source DC voltage of the NMOS transistor Mcas is subtracted from the first bias DC voltage to obtain the drain DC voltage of the NMOS transistor Mmir (the second DC voltage in the first embodiment). The second DC voltage changes with changes of the first bias DC voltage and second bias DC voltage.

Seventh Embodiment

Based on the circuit provided in the above embodiments, a control method is provided in the embodiment of the present disclosure. As shown in FIG. 9, the method includes the following steps.

In step 901, a first DC voltage is compared with a second DC voltage to obtain a comparison result. The first DC voltage is a drain DC voltage of the first transistor of the bias circuit, and the second DC voltage is a drain DC voltage of the second transistor of the bias circuit.

In step 902, the first DC voltage and the second DC voltage are adjusted by using the comparison result such that the drain DC voltage of the first transistor is equal to the drain DC voltage of the second transistor when the bias circuit is in operation.

In the above steps, a gate of the first transistor is connected to a gate of the second transistor via a resistor that attenuates an AC signal. The first transistor and the second transistor amplify an input reference DC current of the DC current bias circuit to obtain a bias DC current, and the second transistor generates a target output signal based on an input signal of the bias circuit by using the bias DC current.

In some applications, the input signal of the bias circuit may be a radio frequency input signal. The target output signal of the bias circuit may be radio frequency output signals having different power levels. In case that the target output signals have different power levels, a bias circuit is needed to provide different bias DC currents. Here, the first transistor and the second transistor amplify the input reference DC current of the bias circuit by adjusting an input reference DC current of the bias circuit to obtain the bias DC current that meets an actual demand. The second transistor generates the target output signals having different power levels based on the input signal of the bias circuit by using the bias DC current.

The bias circuit can generate different output powers. Meanwhile, the bias circuit can adjust the input reference DC current and the bias state of the first transistor and second transistor based on actual requirements, such that the bias circuit can realize a more stable performance in terms of power level and linearity.

The magnitude of output power generated by the bias circuit relates to factors such as the magnitude of bias current and the magnitude of the input AC signal.

In some applications, during operation of the bias circuit, when a change of a gate DC voltage of the first transistor causes a change of the drain DC voltage of the first transistor and a change of the drain DC voltage of the second transistor, the first DC voltage (the drain DC voltage of the first transistor) is compared with the second DC voltage (the drain DC voltage of the second transistor) to obtain a comparison result. The gate DC voltage of the first transistor and a gate DC voltage of the second transistor are controlled by using the comparison result. The drain DC voltage of the first transistor is achieved to be equal to the drain DC voltage of the second transistor by adjusting an impedance of the first transistor and an impedance of the second transistor.

When the drain DC voltage of the second transistor changes and the drain DC voltage of the first transistor remains unchanged, the first DC voltage (the drain DC voltage of the first transistor) is compared with the second DC voltage (the drain DC voltage of the second transistor) to obtain the comparison result. The gate DC voltage of the first transistor and the gate DC voltage of the second transistor are controlled by using the comparison result. The impedance of the first transistor and the impedance of the second transistor are adjusted such that the drain DC voltage of the first transistor changes with a change of the drain DC voltage of the second transistor, thereby finally ensuring that the drain DC voltage of the first transistor is equal to the drain DC voltage of the second transistor.

When a gate-to-source DC voltage of the first transistor is equal to a gate-to-source DC voltage of the second transistor, and the drain DC voltage of the first transistor is also equal to the drain DC voltage of the second transistor, a ratio of the DC current flowing through the first transistor to the DC current flowing through the second transistor is equal to a ratio of a size of the first transistor to a size of the second transistor.

In some embodiments, the adjusting the first DC voltage and the second DC voltage by using the comparison result includes the following operations.

Conduction degree of the first transistor and conduction degree of the second transistor are controlled by using the comparison result to adjust the first DC voltage and the second DC voltage such that the first DC voltage is equal to the second DC voltage.

The conduction degree indicates that a change of the drain DC voltage of the first transistor and a change of the drain DC voltage of the second transistor are realized by changing the impedance of the first transistor and the impedance of the second transistor.

In some embodiments, the adjusting the first DC voltage and the second DC voltage by using the comparison result includes the following operations.

The conduction degree of the first transistor and the conduction degree of the second transistor are controlled by pulling up or pulling down the gate DC voltage of the first transistor and the gate DC voltage of the second transistor by using the comparison result so as to adjust the first DC voltage and the second DC voltage such that the first DC voltage is equal to the second DC voltage. In some applications, the first DC voltage may not be equal to the second DC voltage due to an influence of a temperature drift, a process drift, or a change in operation conditions.

Eighth Embodiment

In order to implement the above bias circuit, an implementation method for a bias circuit is provided in the embodiment of the present disclosure. As shown in FIG. 10, the method includes the following steps.

In step 1001, the first transistor and the second transistor amplify an input reference DC current of the bias circuit to obtain a bias DC current. The second transistor generates a target output signal based on an input signal of the bias circuit by using the bias DC current.

In step 1002, a third transistor is controlled to output the target output signal by using a generated first bias DC voltage matched with a power level such that the target output signal meets a preset linear relationship.

In operation of the bias circuit, the first DC voltage is compared with the second DC voltage to obtain a comparison result. The first DC voltage is a drain DC voltage of the first transistor, and the second DC voltage is a drain DC voltage of the second transistor. The first DC voltage and the second DC voltage are adjusted by using the comparison result, such that the drain DC voltage of the first transistor is equal to the drain DC voltage of the second transistor when the bias circuit is in operation.

In some applications, the input signal of the bias circuit may be a radio frequency input signal. The target output signal of the bias circuit may be radio frequency output signals having different power levels. In case that the power levels of the target output signals are different, a bias circuit is needed to provide different bias DC currents. Here, the first transistor and the second transistor amplify the input reference DC current of the bias circuit by adjusting an input reference DC current of the bias circuit to obtain the bias DC current that meets an actual demand. The second transistor generates the target output signals having different power levels based on the input signal of the bias circuit by using the bias DC current.

In some applications, a bias state of the first transistor and a bias state of the second transistor are adjusted. Specifically, the first DC voltage and the second DC voltage are adjusted based on the comparison result of the first DC voltage and second DC voltage, such that the drain DC voltage of the first transistor and the drain DC voltage of the second transistor follow each other in operation of the bias circuit. The first transistor and the second transistor can amplify the input reference DC current of the bias circuit by adjusting the input reference DC current of the bias circuit to generate different bias DC currents The second transistor may generate the target output signals having different power levels based on the input signal of the bias circuit by using the bias DC current. And the target output signal is outputted by the third transistor such that the bias circuit can realize a more stable performance in terms of power level and linearity.

In some embodiments, the adjusting the first DC voltage and the second DC voltage by using the comparison result includes: controlling conduction degree of the first transistor and conduction degree of the second transistor by using the comparison result to adjust the first DC voltage and second DC voltage.

In some embodiments, the adjusting the first DC voltage and the second DC voltage by using the comparison result includes: controlling the conduction degree of the first transistor and the conduction degree of the second transistor by pulling up or pulling down the gate DC voltage of the first transistor and the gate DC voltage of the second transistor with the comparison result to adjust the first DC voltage and the second DC voltage.

In some embodiments, the method further includes the following operations.

A second bias DC voltage matched with the power level is generated, and the second bias DC voltage is the gate DC voltage of the first transistor and the gate DC voltage of the second transistor. The first bias DC voltage and the second bias DC voltage meet a preset condition. The second DC voltage changes with changes of the first bias DC voltage and second bias DC voltage. The first bias DC voltage and the second bias DC voltage meet the preset condition indicates that a difference between the first bias DC voltage and the second bias DC voltage can be adjusted by an adjustable resistor and constant current source. That is, the difference between the first bias DC voltage and the second bias DC voltage is equal to a voltage drop across the adjustable resistor.

In some embodiments, the method further includes the following operations.

At least one first bias DC voltage matched with the power level is generated by using at least one resistor and at least one current source. Each of the at least one first bias DC voltage controls one third transistor to output the target output signal, such that the target output signal meets a preset linear relation.

The foregoing is only a preferred embodiment of the present disclosure and is not intended to limit the scope of protection of the present disclosure.

In the technical solution of the present disclosure, a first DC voltage is compared with a second DC voltage to obtain a comparison result, where the first DC voltage is a drain DC voltage of the first transistor, and the second DC voltage is a drain DC voltage of the second transistor. The first DC voltage and the second DC voltage are adjusted by using the comparison result such that the drain DC voltage of the first transistor is equal to the drain DC voltage of the second transistor when the bias circuit is in operation, where a gate of the first transistor is connected to a gate of the second transistor, the first transistor and the second transistor amplify an input reference DC current of the bias circuit to obtain a bias DC current, and the second transistor generates a target output signal based on an input signal of the bias circuit by using the bias DC current. The first DC voltage and the second DC voltage are adjusted by using the comparison result of the first DC voltage and the second DC voltage, such that the drain DC voltage of the first transistor is equal to the drain DC voltage of the second transistor. In this way, the bias circuit can realize a more stable performance in terms of power level and linearity under the influence of external factors such as a temperature drift and a process drift.

The invention claimed is:

1. An electronic device comprising a control circuit, applied to a bias circuit, the control circuit comprising: a first transistor and a second transistor, wherein a gate of the first transistor is connected to a gate of the second transistor, the first transistor and the second transistor are configured to amplify an input reference direct current (DC) current of the bias circuit to obtain a bias DC current, and the second transistor generates a target output signal based on an input signal of the bias circuit by using the bias DC current;

wherein the control circuit comprises:
    a detection circuit, configured to compare a first DC voltage with a second DC voltage to obtain a comparison result, wherein the first DC voltage is a drain DC voltage of the first transistor, and the second DC voltage is a drain DC voltage of the second transistor; and
    an adjustment circuit, configured to adjust the first DC voltage and the second DC voltage by using the comparison result, such that the drain DC voltage of the first transistor is equal to the drain DC voltage of the second transistor when the bias circuit is in operation;
the bias circuit comprising: a first transistor, a second transistor, a third transistor, a control circuit and a voltage generation circuit; wherein:
a gate of the first transistor is connected to a gate of the second transistor; the first transistor and the second transistor are configured to amplify an input reference direct current (DC) current of the bias circuit to obtain a bias DC current, and the second transistor generates a target output signal based on an input signal of the bias circuit by using the bias DC current;
the voltage generation circuit is configured to control the third transistor to output the target output signal by using a generated first bias DC voltage matched with a power level, such that the target output signal meets a preset linear relationship.

2. The electronic device according to claim 1, wherein the adjustment circuit is configured to control conduction degree of the first transistor and conduction degree of the second transistor by using the comparison result, so as to adjust the first DC voltage and the second DC voltage.

3. The electronic device according to claim 1, wherein the adjustment circuit is configured to control conduction degree of the first transistor and conduction degree of the second transistor by pulling up or pulling down the drain DC voltage of the first transistor and the drain DC voltage of the second transistor by using the comparison result, so as to adjust the first DC voltage and the second DC voltage.

4. A bias circuit, comprising: a first transistor, a second transistor, a third transistor, a control circuit and a voltage generation circuit; wherein
    a gate of the first transistor is connected to a gate of the second transistor; the first transistor and the second transistor are configured to amplify an input reference direct current (DC) current of the bias circuit to obtain a bias DC current, and the second transistor generates a target output signal based on an input signal of the bias circuit by using the bias DC current;
    the voltage generation circuit is configured to control the third transistor to output the target output signal by using a generated first bias DC voltage matched with a power level, such that the target output signal meets a preset linear relationship;
    the control circuit comprises: a detection circuit, configured to compare a first DC voltage with a second DC voltage to obtain a comparison result, wherein the first DC voltage is a drain DC voltage of the first transistor, and the second DC voltage is a drain DC voltage of the second transistor; an adjustment circuit, configured to adjust the first DC voltage and the second DC voltage by using the comparison result, such that the drain DC voltage of the first transistor is equal to the drain DC voltage of the second transistor when the bias circuit is in operation.

5. The bias circuit according to claim 4, wherein the adjustment circuit is configured to control conduction degree of the first transistor and conduction degree of the second transistor by using the comparison result, so as to adjust the first DC voltage and the second DC voltage.

6. The bias circuit according to claim 4, wherein the adjustment circuit is configured to control conduction degree of the first transistor and conduction degree of the second transistor by pulling up or pulling down the drain DC voltage of the first transistor and the drain DC voltage of the second transistor by using the comparison result, so as to adjust the first DC voltage and the second DC voltage.

7. The bias circuit according to claim 4, wherein the voltage generation circuit is further configured to generate a second bias DC voltage matched with a power level, wherein the second bias DC voltage is a gate DC voltage of the first transistor and a gate DC voltage of the second transistor, the first bias DC voltage and the second bias DC voltage meet a preset condition; the second DC voltage changes with changes of the first bias DC voltage and second bias DC voltage.

8. The bias circuit according to claim 4, wherein the voltage generation circuit is configured to generate at least one first bias DC voltage matched with the power level by using at least one resistor and at least one current source, wherein each of the at least one first bias DC voltage controls one third transistor to output the target output signal, such that the target output signal meets the preset linear relationship.

9. A control method, comprising:
  comparing a first direct current (DC) voltage with a second DC voltage to obtain a comparison result, wherein the first DC voltage is a drain DC voltage of a first transistor of a bias circuit, and the second DC voltage is a drain DC voltage of a second transistor of the bias circuit;
  adjusting the first DC voltage and the second DC voltage by using the comparison result, such that the drain DC voltage of the first transistor is equal to the drain DC voltage of the second transistor when the bias circuit is in operation; wherein a gate of the first transistor is connected to a gate of the second transistor, the first transistor and the second transistor amplify an input reference DC current of the bias circuit to obtain a bias DC current, and the second transistor generates a target output signal based on an input signal of the bias circuit by using the bias DC current;
    wherein the method is applied to a bias circuit comprising: a first transistor, a second transistor, a third transistor, a control circuit and a voltage generation circuit; wherein
  a gate of the first transistor is connected to a gate of the second transistor; the first transistor and the second transistor are configured to amplify an input reference direct current (DC) current of the bias circuit to obtain a bias DC current, and the second transistor generates a target output signal based on an input signal of the bias circuit by using the bias DC current;
  the voltage generation circuit is configured to control the third transistor to output the target output signal by using a generated first bias DC voltage matched with a power level, such that the target output signal meets a preset linear relationship; and
  the control circuit comprises: a detection circuit, configured to compare the first DC voltage with the second DC voltage to obtain the comparison result; an adjustment circuit, configured to adjust the first DC voltage and the second DC voltage by using the comparison result, such that the drain DC voltage of the first transistor is equal to the drain DC voltage of the second transistor when the bias circuit is in operation.

10. The method according to claim 9, the adjusting the first DC voltage and the second DC voltage by using the comparison result comprising:
  controlling conduction degree of the first transistor and conduction degree of the second transistor by using the comparison result, so as to adjust the first DC voltage and the second DC voltage.

11. The method according to claim 9, the adjusting the first DC voltage and the second DC voltage with the comparison result comprising:
  controlling the conduction degree of the first transistor and the conduction degree of the second transistor by pulling up or pulling down a gate voltage of the first transistor and a gate voltage of the second transistor by using the comparison result so as to adjust a first voltage and a second voltage.

12. An electronic apparatus comprising a control circuit applied to a bias circuit, the control circuit comprising: a first transistor and a second transistor, wherein a gate of the first transistor is connected to a gate of the second transistor, the first transistor and the second transistor are configured to amplify an input reference direct current (DC) current of the bias circuit to obtain a bias DC current, and the second transistor generates a target output signal based on an input signal of the bias circuit by using the bias DC current; wherein the control circuit comprises:
  a detection circuit, configured to compare a first DC voltage with a second DC voltage to obtain a comparison result, wherein the first DC voltage is a drain DC voltage of the first transistor, and the second DC voltage is a drain DC voltage of the second transistor; and
  an adjustment circuit, configured to adjust the first DC voltage and the second DC voltage by using the comparison result, such that the drain DC voltage of the first transistor is equal to the drain DC voltage of the second transistor when the bias circuit is in operation;
  the electronic apparatus further comprising the bias circuit including: a first transistor, a second transistor, a third transistor, a control circuit and a voltage generation circuit; wherein
  a gate of the first transistor is connected to a gate of the second transistor; the first transistor and the second transistor are configured to amplify an input reference direct current (DC) current of the bias circuit to obtain a bias DC current, and the second transistor generates a target output signal based on an input signal of the bias circuit by using the bias DC current; and
  the voltage generation circuit is configured to control the third transistor to output the target output signal by using a generated first bias DC voltage matched with a power level, such that the target output signal meets a preset linear relationship.

13. The electronic apparatus according to claim 12, wherein the adjustment circuit is configured to control conduction degree of the first transistor and conduction degree of the second transistor by using the comparison result, so as to adjust the first DC voltage and the second DC voltage.

14. The electronic apparatus according to claim 13, wherein the adjustment circuit is configured to control conduction degree of the first transistor and conduction degree of the second transistor by pulling up or pulling down the drain DC voltage of the first transistor and the drain DC voltage of the second transistor by using the comparison result, so as to adjust the first DC voltage and the second DC voltage.

15. The electronic apparatus according to claim 14, wherein the voltage generation circuit is further configured to generate a second bias DC voltage matched with a power level, wherein the second bias DC voltage is a gate DC voltage of the first transistor and a gate DC voltage of the second transistor, the first bias DC voltage and the second bias DC voltage meet a preset condition; the second DC voltage changes with changes of the first bias DC voltage and second bias DC voltage.

16. The electronic apparatus according to claim 15, wherein the voltage generation circuit is configured to generate at least one first bias DC voltage matched with the power level by using at least one resistor and at least one current source, wherein each of the at least one first bias DC voltage controls one third transistor to output the target output signal, such that the target output signal meets the preset linear relationship.

17. The electronic apparatus according to claim 16, wherein the adjustment circuit is configured to control conduction degree of the first transistor and conduction degree of the second transistor by using the comparison result, so as to adjust the first DC voltage and the second DC voltage.

18. The electronic apparatus according to claim 16, wherein the adjustment circuit is configured to control conduction degree of the first transistor and conduction degree of the second transistor by pulling up or pulling down the drain DC voltage of the first transistor and the drain DC voltage of the second transistor by using the comparison result, so as to adjust the first DC voltage and the second DC voltage.

* * * * *